United States Patent
Shenoy et al.

(10) Patent No.: US 9,383,259 B2
(45) Date of Patent: Jul. 5, 2016

(54) METHOD, APPARATUS AND COMPUTER PROGRAM PRODUCT FOR SENSING OF VISIBLE SPECTRUM AND NEAR INFRARED SPECTRUM

(71) Applicant: Nokia Technologies Oy, Espoo (FI)

(72) Inventors: Ravi Shenoy, Bangalore (IN); Krishna Annasagar Govindarao, Bangalore (IN); Mithun Uliyar, Bangalore (IN); Veldandi Muninder, Bangalore (IN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/466,119

(22) Filed: Aug. 22, 2014

(65) Prior Publication Data
US 2015/0060645 A1    Mar. 5, 2015

(30) Foreign Application Priority Data
Aug. 29, 2013    (IN) .......................... 3868/CHE/2013

(51) Int. Cl.
*G01J 5/00*  (2006.01)
*G01J 3/28*  (2006.01)
(Continued)

(52) U.S. Cl.
CPC .............. *G01J 3/2823* (2013.01); *G01J 3/0213* (2013.01); *G01J 3/32* (2013.01); *G02B 5/201* (2013.01); *G02B 5/208* (2013.01); *H01L 27/14625* (2013.01); *H04N 9/045* (2013.01); *G01J 2003/283* (2013.01); *G01J 2003/323* (2013.01)

(58) Field of Classification Search
CPC ..................................................... G01J 3/2823
USPC ................................... 250/338.1, 330, 208.1
See application file for complete search history.

(56) References Cited

U.S. PATENT DOCUMENTS

| | | |
|---|---|---|
| 3,143,654 A | 8/1964 | Aroyan et al. |
| 6,759,646 B1 | 7/2004 | Acharya et al. |

(Continued)

FOREIGN PATENT DOCUMENTS

JP    2008-072337 A    3/2008

OTHER PUBLICATIONS

Extended European Search Report received for corresponding European Patent Application No. 14182188.4, dated Feb. 20, 2015, 10 pages.
(Continued)

*Primary Examiner* — David Porta
*Assistant Examiner* — Meenakshi Sahu
(74) *Attorney, Agent, or Firm* — Alston & Bird LLP (57) ABSTRACT

In accordance with an example embodiment a method, apparatus and computer program product are provided. The method comprises filtering incident light by an IR cut-off filter to generate filtered light. The IR cut-off filter comprises a plurality of pixels with pass-band characteristics for visible light wavelengths and is configured to perform stop-band attenuation of near infrared (NIR) wavelengths. The stop-band attenuation is configured to vary based on spatial location of pixels within the IR cut-off filter. The filtered light received from the IR cut-off filter is sensed by the image sensor to generate sensed light. A baseband signal and a modulated NIR signal are determined by performing transformation of the sensed light. A NIR spectrum associated with the incident light is determined by demodulating the modulated NIR signal. A visible spectrum associated with the incident light is determined based on the NIR spectrum and the baseband signal.

22 Claims, 8 Drawing Sheets (51) Int. Cl.
*H04N 9/04* (2006.01)
*H01L 27/146* (2006.01)
*G02B 5/20* (2006.01)
*G01J 3/02* (2006.01)
*G01J 3/32* (2006.01)

(56) References Cited

U.S. PATENT DOCUMENTS

| | | | |
|---|---|---|---|
| 7,035,451 | B2 | 4/2006 | Harman et al. |
| 7,460,160 | B2 | 12/2008 | Hershey et al. |
| 2004/0056966 | A1 | 3/2004 | Schechner et al. |
| 2009/0304280 | A1 | 12/2009 | Aharoni et al. |
| 2010/0220229 | A1 | 9/2010 | Sano |
| 2011/0243443 | A1 | 10/2011 | Varekamp |
| 2011/0260059 | A1* | 10/2011 | Jiang .................. H01L 27/1461 250/330 |
| 2011/0267482 | A1* | 11/2011 | Wetzstein ................. G06T 5/50 348/218.1 |
| 2013/0127823 | A1 | 5/2013 | Diverdi et al. |
| 2014/0078298 | A1 | 3/2014 | Kudenov et al. |

OTHER PUBLICATIONS

Sanders et al., "Imaging With Frequency Modulated Reticles", Optical Engineering, vol. 30, No. 11, Nov. 1991, pp. 1720-1724.
Brosch, N. et al., *Segmentation-Based Depth Propagation in Videos*, Proceedings of the OAGM/AAPR Workshop, (2011) 15 pages.
Guttmann, M. et al., *Semi-automatic Stereo Extraction from Video Footage*, Computer Vision, IEEE 12th International Conference (2009).
*Optical—Reinventing 3D* [online] [retrieved Nov. 25, 2015]. Retreived from the Internet: <URL: http://www.qptical.com/technology.html>. (2013) 2 pages.
*Technology—PrimeSense* [online] [retrieved Nov. 25, 2015]. Retrieved via the Internet Archive Wayback Machine at https://web.archive.org/web/20131229170120/http://www.primesense.com/solutions/technology/ (2013) 5 pages.
Wetzstein et al., "Computational Plenoptic Imaging", Computer Graphics Forum, vol. 30, Issue: 8, Dec. 2011, pp. 2397-2426.
Sadeghipoor et al., "A novel compressive sensing approach to simultaneously acquire color and near-infrared images on a single sensor", IEEE International Conference on Acoustics, Speech and Signal Processing, May 26-31, 2013, 5 pages.
Kim et al., "A 1.5Mpixel RGBZ CMOS image sensor for simultaneous color and range image capture", IEEE International Solid-State Circuits Conference Digest of Technical Papers, Feb. 19-23, 2012, pp. 392-394.
Levin et al., "Image and Depth from a Conventional Camera with a Coded Aperture", Proceedings of ACM Siggraph, vol. 26, Issue: 3, Jul. 2007, 9 pages.

* cited by examiner

METHOD, APPARATUS AND COMPUTER PROGRAM PRODUCT FOR SENSING OF VISIBLE SPECTRUM AND NEAR INFRARED SPECTRUM

TECHNICAL FIELD

Various implementations relate generally to method, apparatus and computer program product for sensing of visible spectrum and near infrared spectrum.

BACKGROUND

Imaging systems, such as digital cameras, include one or more image sensors for capturing images. The image sensors are sensitive to incident light, such as light reflected from objects of interest, which facilitates in capturing of the images. However, the image sensors are sensitive not just to wavelengths of light in the visible spectrum, but also to wavelengths of light in the infrared (IR) spectrum. As a result, an ability of the image sensors to reproduce the original colours of the object is reduced. Accordingly, an IR cut-off filter is employed in the optical path between the lens and the image sensor to suppress the IR wavelengths from reaching the image sensor. However, on account of filtering out the IR wavelengths, valuable information is lost. For example, near infrared (NIR) wavelengths (700-1100 nanometers), which are known to aid in a variety of applications, are filtered out by the IR cut-off filter. Solutions such as those utilizing structured lighting along with a dedicated sensor for capturing the NIR wavelengths require complex arrangements and are prohibitively expensive. In some cases, a colour filter array is modified to include NIR or time of flight (TOF) pixels. However, such an arrangement introduces significant challenges in preserving an image quality since visible light is sampled less to accommodate NIR/TOF pixels in the colour filter array.

SUMMARY OF SOME EMBODIMENTS

Various aspects of example embodiments are set out in the claims.

In a first aspect, there is provided a method comprising: filtering incident light by an IR cut-off filter disposed in an optical path between a lens and an image sensor to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; sensing the filtered light received from the IR cut-off filter by the image sensor to generate sensed light; determining a baseband signal and a modulated NIR signal by performing transformation of the sensed light; determining a NIR spectrum associated with the incident light by demodulating the modulated NIR signal; and determining a visible spectrum associated with the incident light based on the NIR spectrum and the baseband signal.

In a second aspect, there is provided an apparatus comprising an image capture module comprising: a lens configured to receive incident light; an IR cut-off filter configured to receive the incident light from the lens and filter the incident light to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; and an image sensor configured to sense the filtered light received from the IR cut-off filter to generate sensed light; at least one processor; and at least one memory comprising computer program code, the at least one memory and the computer program code configured to, with the at least one processor, cause the apparatus to at least perform: determine a baseband signal and a modulated NIR signal by performing transformation of the sensed light; determine a NIR spectrum associated with the incident light by demodulating the modulated NIR signal; and determine a visible spectrum associated with the incident light based on the NIR spectrum and the baseband signal.

In a third aspect, there is provided a computer program product comprising at least one computer-readable storage medium, the computer-readable storage medium comprising a set of instructions, which, when executed by one or more processors, cause an apparatus to at least perform: filter incident light by an IR cut-off filter disposed in an optical path between a lens and an image sensor to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; sense the filtered light received from the IR cut-off filter by the image sensor to generate sensed light; determine a baseband signal and a modulated NIR signal by performing transformation of the sensed light; determine a NIR spectrum associated with the incident light by demodulating the modulated NIR signal; and determine a visible spectrum associated with the incident light based on the NIR spectrum and the baseband signal.

In a fourth aspect, there is provided an apparatus comprising: an image capture module comprising: a lens configured to receive incident light; an IR cut-off filter configured to receive the incident light from the lens and filter the incident light to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; and an image sensor configured to sense the filtered light received from the IR cut-off filter to generate sensed light; means for determining a baseband signal and a modulated NIR signal by performing transformation of the sensed light; means for determining a NIR spectrum associated with the incident light by demodulating the modulated NIR signal; and means for determining a visible spectrum associated with the incident light based on the NIR spectrum and the baseband signal.

In a fifth aspect, there is provided a computer program comprising program instructions which when executed by an apparatus, cause the apparatus to: filter incident light by an IR cut-off filter disposed in an optical path between a lens and an image sensor to generate filtered light, the IR cut-off filter comprising a plurality of pixels with pass-band characteristics for visible wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; sense the filtered light received from the IR cut-off filter by the image sensor to generate sensed light; determine a baseband signal and a modulated NIR signal by performing transformation of the sensed light; determine a NIR spectrum associated with the incident light by demodulating the modulated NIR signal; and determine a visible spectrum associated with the incident light based on the NIR spectrum and the baseband signal.

BRIEF DESCRIPTION OF THE FIGURES

Various embodiments are illustrated by way of example, and not by way of limitation, in the figures of the accompanying drawings in which.

DETAILED DESCRIPTION

Example embodiments and their potential effects are understood by referring to FIGS. 1 through 8 of the drawings.

Figure 1:
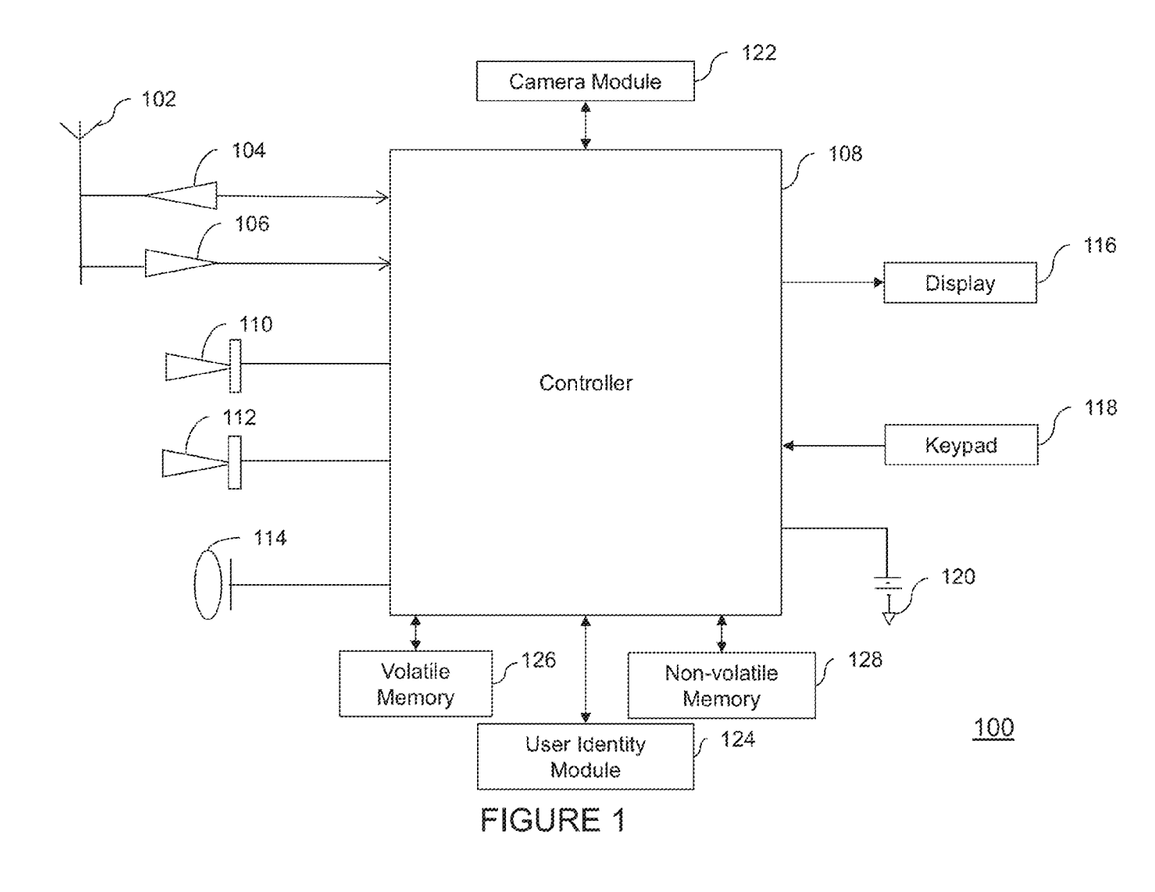
FIG. 1 illustrates a device in accordance with an example embodiment.

FIG. 1 illustrates a device 100 in accordance with an example embodiment. It should be understood, however, that the device 100 as illustrated and hereinafter described is merely illustrative of one type of device that may benefit from various embodiments, therefore, should not be taken to limit the scope of the embodiments. As such, it should be appreciated that at least some of the components described below in connection with the device 100 may be optional and thus in an example embodiment may include more, less or different components than those described in connection with the example embodiment of FIG. 1. The device 100 could be any of a number of types of mobile electronic devices, for example, portable digital assistants (PDAs), pagers, mobile televisions, gaming devices, cellular phones, all types of computers (for example, laptops, mobile computers or desktops), cameras, audio/video players, radios, global positioning system (GPS) devices, media players, mobile digital assistants, or any combination of the aforementioned, and other types of communications devices.

The device 100 may include an antenna 102 (or multiple antennas) in operable communication with a transmitter 104 and a receiver 106. The device 100 may further include an apparatus, such as a controller 108 or other processing device that provides signals to and receives signals from the transmitter 104 and receiver 106, respectively. The signals may include signaling information in accordance with the air interface standard of the applicable cellular system, and/or may also include data corresponding to user speech, received data and/or user generated data. In this regard, the device 100 may be capable of operating with one or more air interface standards, communication protocols, modulation types, and access types. By way of illustration, the device 100 may be capable of operating in accordance with any of a number of first, second, third and/or fourth-generation communication protocols or the like. For example, the device 100 may be capable of operating in accordance with second-generation (2G) wireless communication protocols IS-136 (time division multiple access (TDMA)), GSM (global system for mobile communication), and IS-95 (code division multiple access (CDMA)), or with third-generation (3G) wireless communication protocols, such as Universal Mobile Telecommunications System (UMTS), CDMA1000, wideband CDMA (WCDMA) and time division-synchronous CDMA (TD-SCDMA), with 3.9G wireless communication protocol such as evolved-universal terrestrial radio access network (E-UTRAN), with fourth-generation (4G) wireless communication protocols, or the like. As an alternative (or additionally), the device 100 may be capable of operating in accordance with non-cellular communication mechanisms. For example, computer networks such as the Internet, local area network, wide area networks, and the like; short range wireless communication networks such as Bluetooth® networks, Zigbee® networks, Institute of Electric and Electronic Engineers (IEEE) 802.11x networks, and the like; wireline telecommunication networks such as public switched telephone network (PSTN).

The controller 108 may include circuitry implementing, among others, audio and logic functions of the device 100. For example, the controller 108 may include, but are not limited to, one or more digital signal processor devices, one or more microprocessor devices, one or more processor(s) with accompanying digital signal processor(s), one or more processor(s) without accompanying digital signal processor(s), one or more special-purpose computer chips, one or more field-programmable gate arrays (FPGAs), one or more controllers, one or more application-specific integrated circuits (ASICs), one or more computer(s), various analog to digital converters, digital to analog converters, and/or other support circuits. Control and signal processing functions of the device 100 are allocated between these devices according to their respective capabilities. The controller 108 thus may also include the functionality to convolutionally encode and interleave message and data prior to modulation and transmission. The controller 108 may additionally include an internal voice coder, and may include an internal data modem. Further, the controller 108 may include functionality to operate one or more software programs, which may be stored in a memory. For example, the controller 108 may be capable of operating a connectivity program, such as a conventional Web browser. The connectivity program may then allow the device 100 to transmit and receive Web content, such as location-based content and/or other web page content, according to a Wireless Application Protocol (WAP), Hypertext Transfer Protocol (HTTP) and/or the like. In an example embodiment, the controller 108 may be embodied as a multi-core processor such as a dual or quad core processor. However, any number of processors may be included in the controller 108.

The device 100 may also comprise a user interface including an output device such as a ringer 110, an earphone or speaker 112, a microphone 114, a display 116, and a user input interface, which may be coupled to the controller 108. The user input interface, which allows the device 100 to receive data, may include any of a number of devices allowing the device 100 to receive data, such as a keypad 118, a touch display, a microphone or other input device. In embodiments including the keypad 118, the keypad 118 may include numeric (0-9) and related keys (#, *), and other hard and soft keys used for operating the device 100. Alternatively or additionally, the keypad 118 may include a conventional QWERTY keypad arrangement. The keypad 118 may also include various soft keys with associated functions. In addition, or alternatively, the device 100 may include an interface device such as a joystick or other user input interface. The device 100 further includes a battery 120, such as a vibrating battery pack, for powering various circuits that are used to operate the device 100, as well as optionally providing mechanical vibration as a detectable output.

In an example embodiment, the device 100 includes a media capturing element, such as a camera, video and/or audio module, in communication with the controller 108. The media capturing element may be any means for capturing an image, video and/or audio for storage, display or transmission. In an example embodiment, the media capturing element is a camera module 122 which may include a digital camera capable of forming a digital image file from a captured image. As such, the camera module 122 includes all hardware, such as a lens or other optical component(s), and software for creating a digital image file from a captured image. Alternatively, or additionally, the camera module 122 may include the hardware needed to view an image, while a memory device of the device 100 stores instructions for execution by the controller 108 in the form of software to create a digital image file from a captured image. In an example embodiment, the camera module 122 may further include a processing element such as a co-processor, which assists the controller 108 in processing image data and an encoder and/or decoder for compressing and/or decompressing image data. The encoder and/or decoder may encode and/or decode according to a JPEG standard format or another like format. For video, the encoder and/or decoder may employ any of a plurality of standard formats such as, for example, standards associated with H.261, H.262/MPEG-2, H.263, H.264, H.264/MPEG-4, MPEG-4, and the like. In some cases, the camera module 122 may provide live image data to the display 116. In an example embodiment, the display 116 may be located on one side of the device 100 and the camera module 122 may include a lens positioned on the opposite side of the device 100 with respect to the display 116 to enable the camera module 122 to capture images on one side of the device 100 and present a view of such images to the user positioned on the other side of the device 100.

The device 100 may further include a user identity module (UIM) 124. The UIM 124 may be a memory device having a processor built in. The UIM 124 may include, for example, a subscriber identity module (SIM), a universal integrated circuit card (UICC), a universal subscriber identity module (USIM), a removable user identity module (R-UIM), or any other smart card. The UIM 124 typically stores information elements related to a mobile subscriber. In addition to the UIM 124, the device 100 may be equipped with memory. For example, the device 100 may include volatile memory 126, such as volatile random access memory (RAM) including a cache area for the temporary storage of data. The device 100 may also include other non-volatile memory 128, which may be embedded and/or may be removable. The non-volatile memory 128 may additionally or alternatively comprise an electrically erasable programmable read only memory (EEPROM), flash memory, hard drive, or the like. The memories may store any number of pieces of information, and data, used by the device 100 to implement the functions of the device 100.

Figure 2:
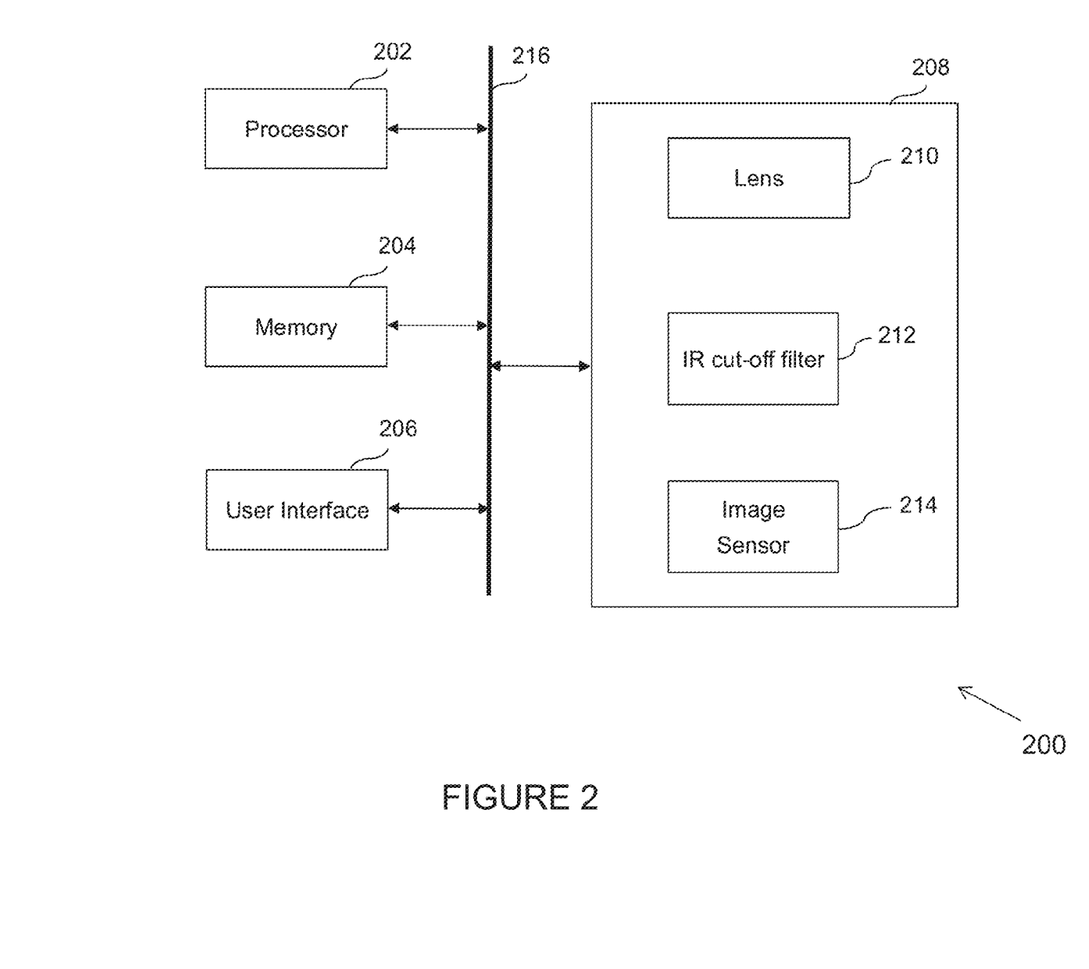
FIG. 2 illustrates an apparatus for sensing of visible spectrum and near infrared spectrum in accordance with an example embodiment.

FIG. 2 illustrates an apparatus 200 for sensing of visible spectrum and near infrared (NIR) spectrum in accordance with an example embodiment. The apparatus 200 for sensing of the visible spectrum and the NIR spectrum may be employed, for example, in the device 100 of FIG. 1. However, it should be noted that the apparatus 200, may also be employed on a variety of other devices both mobile and fixed, and therefore, embodiments should not be limited to application on devices such as the device 100 of FIG. 1. Alternatively, embodiments may be employed on a combination of devices including, for example, those listed above. Accordingly, various embodiments may be embodied wholly at a single device, (for example, the device 100) or in a combination of devices. It should also be noted that the devices or elements described below may not be mandatory and thus some may be omitted in certain embodiments.

The apparatus 200 includes or otherwise is in communication with at least one processor 202 and at least one memory 204. Examples of the at least one memory 204 include, but are not limited to, volatile and/or non-volatile memories. Some examples of the volatile memory include, but are not limited to, random access memory, dynamic random access memory, static random access memory, and the like. Some examples of the non-volatile memory include, but are not limited to, hard disks, magnetic tapes, optical disks, programmable read only memory, erasable programmable read only memory, electrically erasable programmable read only memory, flash memory, and the like. The memory 204 may be configured to store information, data, applications, instructions or the like for enabling the apparatus 200 to carry out various functions in accordance with various example embodiments. For example, the memory 204 may be configured to store images captured using various components of the apparatus 200. Additionally or alternatively, the memory 204 may be configured to store instructions for execution by the processor 202.

An example of the processor 202 may include the controller 108. The processor 202 may be embodied in a number of different ways. The processor 202 may be embodied as a multi-core processor, a single core processor; or combination of multi-core processors and single core processors. For example, the processor 202 may be embodied as one or more of various processing means such as a coprocessor, a microprocessor, a controller, a digital signal processor (DSP), processing circuitry with or without an accompanying DSP, or various other processing devices including integrated circuits such as, for example, an application specific integrated circuit (ASIC), a field programmable gate array (FPGA), a microcontroller unit (MCU), a hardware accelerator, a special-purpose computer chip, or the like. In an example embodiment, the multi-core processor may be configured to execute instructions stored in the memory 204 or otherwise accessible to the processor 202. Alternatively or additionally, the processor 202 may be configured to execute hard coded functionality. As such, whether configured by hardware or software methods, or by a combination thereof, the processor 202 may represent an entity, for example, physically embodied in circuitry, capable of performing operations according to various embodiments while configured accordingly. For example, if the processor 202 is embodied as two or more of an ASIC, FPGA or the like, the processor 202 may be specifically configured hardware for conducting the operations described herein. Alternatively, as another example, if the processor 202 is embodied as an executor of software instructions, the instructions may specifically configure the processor 202 to perform the algorithms and/or operations described herein when the instructions are executed. However, in some cases, the processor 202 may be a processor of a specific device, for example, a mobile terminal or network device adapted for employing embodiments by further configuration of the processor 202 by instructions for performing the algorithms and/or operations described herein. The processor 202 may include, among other things, a clock, an arithmetic logic unit (ALU) and logic gates configured to support operations of the processor 202.

A user interface 206 may be in communication with the processor 202. Examples of the user interface 206 include, but are not limited to, input interface and/or output user interface. The input interface is configured to receive an indication of a user input. The output user interface provides an audible, visual, mechanical or other output and/or feedback to the user. Examples of the input interface may include, but are not limited to, a keyboard, a mouse, a joystick, a keypad, a touch screen, soft keys, and the like. Examples of the output interface may include, but are not limited to, a display such as light emitting diode display, thin-film transistor (TFT) display, liquid crystal displays, active-matrix organic light-emitting diode (AMOLED) display, a microphone, a speaker, ringers, vibrators, and the like. In an example embodiment, the user interface 206 may include, among other devices or elements, any or all of a speaker, a microphone, a display, and a keyboard, touch screen, or the like. In this regard, for example, the processor 202 may comprise user interface circuitry configured to control at least some functions of one or more elements of the user interface 206, such as, for example, a speaker, ringer, microphone, display, and/or the like. The processor 202 and/or user interface circuitry comprising the processor 202 may be configured to control one or more functions of one or more elements of the user interface 206 through computer program instructions, for example, software and/or firmware, stored on a memory, for example, the at least one memory 204, and/or the like, accessible to the processor 202.

In an example embodiment, the apparatus 200 may include an electronic device. Some examples of the electronic device include communication device, media capturing device with communication capabilities, computing devices, and the like. Some examples of the communication device may include a mobile phone, a personal digital assistant (PDA), and the like. Some examples of computing device may include a laptop, a personal computer, and the like. In an example embodiment, the electronic device may include a user interface, for example, the user interface 206, having user interface circuitry and user interface software configured to facilitate a user to control at least one function of the electronic device through use of a display and further configured to respond to user inputs. In an example embodiment, the electronic device may include a display circuitry configured to display at least a portion of the user interface of the electronic device. The display and display circuitry may be configured to facilitate the user to control at least one function of the electronic device.

In an example embodiment, the electronic device may be embodied as to include a transceiver. The transceiver may be any device operating or circuitry operating in accordance with software or otherwise embodied in hardware or a combination of hardware and software. For example, the processor 202 operating under software control, or the processor 202 embodied as an ASIC or FPGA specifically configured to perform the operations described herein, or a combination thereof, thereby configures the apparatus or circuitry to perform the functions of the transceiver.

In an example embodiment, the electronic device may be embodied as to include an image capture module 208. The image capture module 208 includes a lens 210, an IR cut-off filter 212 and an image sensor 214. The various components of the image capture module 208 may be in communication with the processor 202 and/or other components of the apparatus 200. The image capture module 208 may be in communication with other imaging circuitries and/or software, and is configured to capture digital image frames or to make a video or other graphic media files. The image capture module 208 and other circuitries, in combination, may be an example of the camera module 122 of the device 100. In certain example embodiments, the image capture module 208 may be external to the apparatus 200, but accessible and/or controlled by the apparatus 200. The image capture module 208 is further explained with reference to FIG. 3.

Figure 3:
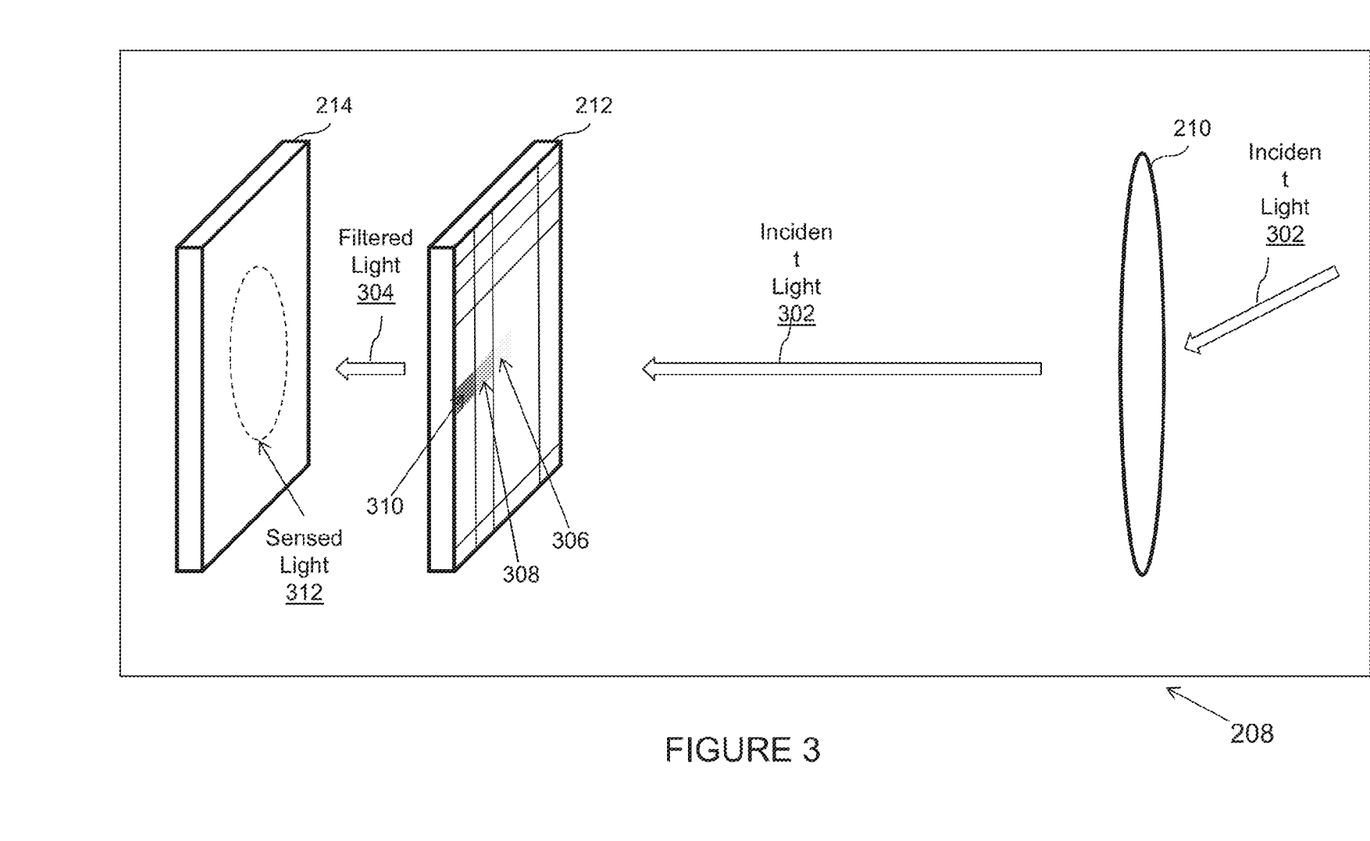
FIG. 3 illustrates an exemplary arrangement of components of image capture module of the apparatus of FIG. 2 in accordance with an example embodiment.

Referring now to FIG. 3, an exemplary arrangement of components of the image capture module 208 of the apparatus 200 of FIG. 2 is illustrated in accordance with an example embodiment. As stated in with reference to FIG. 2, the image capture module 208 includes the lens 210, the IR cut-off filter 212 and the image sensor 214. The IR cut-off filter 212 is depicted to be disposed in the optical path between the lens 210 and the image sensor 214. The lens 210 is configured to receive incident light, such as for example, light reflected from an object of interest during image capture. In an embodiment, a user may provide an indication of user intent to capture an image and/or video using the user interface 206 of the apparatus 200, which may cause the processor 202 and the memory 204 of the apparatus 200 to cause the lens 210 to receive incident light, such as incident light 302. The lens 210 may be configured to direct the incident light 302 along the optical path towards the IR cut-off filter 212.

The IR cut-off filter 212 is configured to receive the incident light 302 from the lens 210 and filter the incident light to generate filtered light 304. The filtered light 304 is directed along the optical path towards the image sensor 214. The IR cut-off filter 212 comprises a plurality of pixels, such as pixel 306, pixel 308 and pixel 310. It is noted that the pixels 306 to 310 are depicted herein for illustration purposes and that the IR cut-off filter 212 comprises a plurality of such pixels. The plurality of pixels is associated with pass-band characteristics for visible wavelengths associated with the incident light 302. The plurality of pixels is further configured to perform stop-band attenuation of NIR wavelengths associated with the incident light 302 for filtering of the incident light 302.

In an embodiment, the stop-band attenuation of the NIR wavelengths is configured to vary based on spatial location of pixels within the IR cut-off filter 212. In an embodiment, the stop-band attenuation of the NIR wavelengths is configured to vary based on a cosine-function of spatial location of the pixels. In an embodiment, the variance of the stop-band attenuation of the NIR wavelengths based on the cosine-function of spatial location of the pixels is achieved by pre-configuring a transparency attribute associated with each pixel of the plurality of pixels. For example, a transparency attribute may vary from pixel-to pixel, with some pixels being completely opaque, some being completely transparent and while some being partly transparent (or partly opaque). In FIG. 3, pixel 306 is depicted to be transparent, whereas pixel 308 is depicted to be partly transparent and pixel 310 is depicted to be opaque. As a result, the stop-band attenuation of the NIR wavelengths may vary from one pixel to another, with pixels permitting low energy to zero energy to pass for the NIR wavelengths. The varying nature of stop-band attenuation by pixels of the IR cut-off filter 212 is further illustrated with reference to exemplary plots in FIGS. 4A and 4B.

Figure 4A:
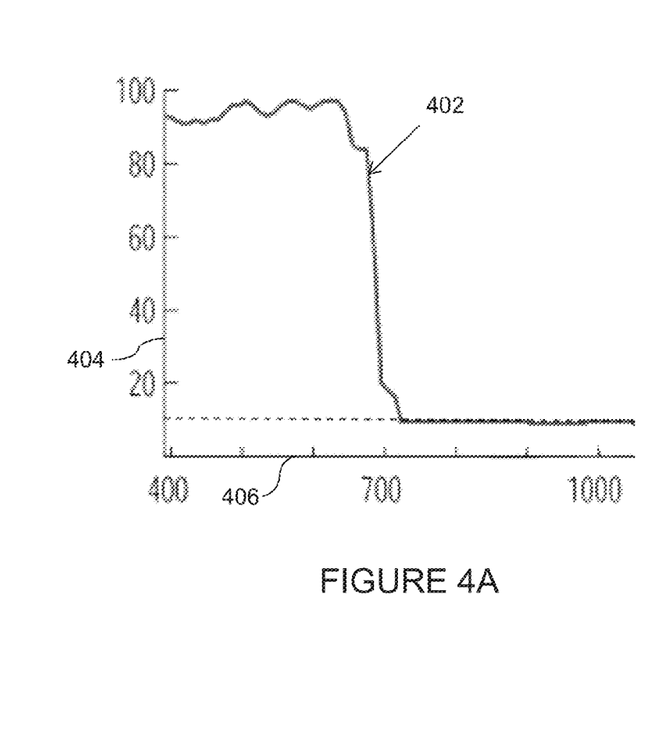
FIGS. 4A and 4B depict two exemplary plots illustrating percentage of light transmitted by two pixels of the IR cut-off filter, respectively, for various wavelengths associated with incident light in accordance with an example embodiment.
Figure 4B:
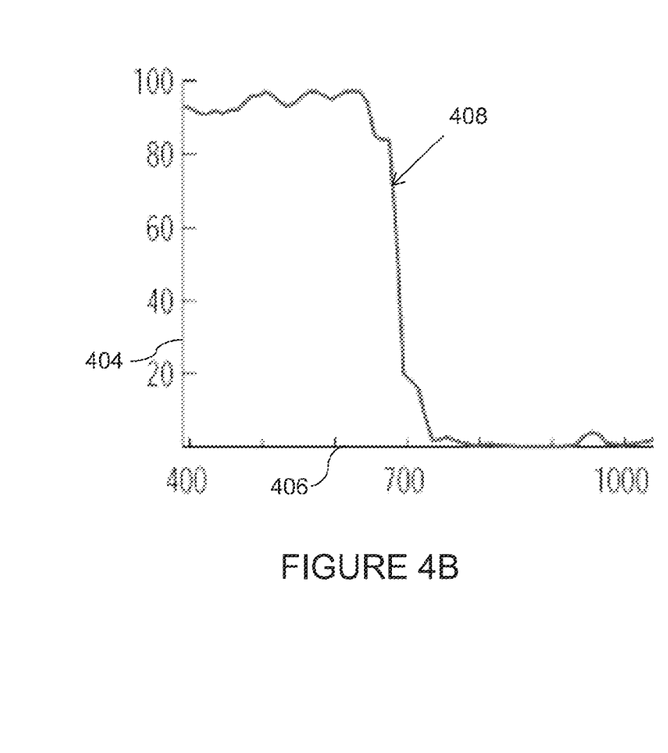

Referring now to FIGS. 4A and 4B, two exemplary plots illustrating percentage of light transmitted by two pixels of the IR cut-off filter 212, respectively, for various wavelengths associated with incident light are depicted, in accordance with an example embodiment. The percentage of light transmitted by a pixel is hereinafter referred to as 'transmission percentage'. Accordingly, FIG. 4A depicts a plot 402 representing change in transmission percentage with change in wavelength corresponding to incident light for a pixel which is substantially transparent, such as the pixel 306 of FIG. 3. FIG. 4B depicts a plot 408 representing change in transmission percentage with change in wavelength corresponding to incident light for a pixel which is substantially opaque, such as the pixel 310 of FIG. 3. In FIGS. 4A and 4B, the Y-axis 404 represents transmission percentage with values ranging from 0 to 100 percent, whereas the X-axis 406 represents wavelengths corresponding to the incident light with values ranging from 0 to 1000 nanometers (nm).

As can be seen from the plot 402 in FIG. 4A, the substantially transparent pixel of the IR cut-off filter 212 allows wavelengths associated with visible spectrum (i.e. visible light wavelengths or wavelengths up to 700 nm) to pass through without any attenuation. Further, the substantially transparent pixel of the IR cut-off filter 212 allows wavelengths associated with NIR spectrum (for example, wavelengths from 700 nm-1100 nm) to pass through with little attenuation (i.e. 10% transmission percentage). Furthermore, the substantially transparent pixel of the IR cut-off filter 212 restricts wavelengths associated with IR spectrum (i.e. wavelengths greater than 1100 nm) from passing through. As a result of such filtering, the filtered light transmitted from the substantially transparent pixel contains energy corresponding to visible light with little overlap from energy corresponding to NIR light.

Further, as can be seen from the plot 408 in FIG. 4B, the substantially opaque pixel of the IR cut-off filter 212 allows wavelengths associated with visible spectrum to pass through without any attenuation. Further, the substantially opaque pixel of the IR cut-off filter 212 heavily attenuates wavelengths associated with NIR spectrum (for example, wavelengths from 700 nm-1100 nm) while completely restricting wavelengths associated with IR spectrum (i.e. wavelengths greater than 1100 nm) from passing through. As a result of such filtering, the filtered light transmitted from the substantially opaque pixel predominantly contains energy corresponding to visible light.

As can be seen from plots 402 and 408, the stop-band attenuation of NIR wavelengths varies from pixel to pixel (for example, one from spatial location to another within the IR cut-off filter 212) on account of varying transparency attribute associated with the pixels. As mentioned with reference to FIG. 3, the stop-band attenuation of the NIR wavelengths is configured to vary based on the cosine-function of spatial location of pixels of the plurality of pixels. The transparency attributes of pixels of the IR cut-off filter 212 are pre-configured in such a manner that the stop-band attenuation of the NIR wavelengths resembles a cosine-function of spatial locations based stop-band attenuation of the NIR wavelengths. Accordingly, the IR cut-off filter 212 may also be referred to as a 'cosine mask' for NIR wavelengths associated with the incident light.

Referring now to FIG. 3, performing the stop-band attenuation of the NIR wavelengths based on a cosine-function of spatial location of the pixels corresponds to performing amplitude modulation of the NIR wavelengths to generate filtered light 304. The image sensor 214 is configured to sense the filtered light 304 received from the IR cut-off filter 212 to generate the sensed light 312.

Referring now to FIG. 2, the components 202-208 of the apparatus 200 may communicate with each other via a centralized circuit system 216 for sensing of the visible spectrum and the NIR spectrum. The centralized circuit system 216 may be various devices configured to, among other things, provide or enable communication between the components 202-208 of the apparatus 200. In certain embodiments, the centralized circuit system 216 may be a central printed circuit board (PCB) such as a motherboard, main board, system board, or logic board. The centralized circuit system 216 may also, or alternatively, include other printed circuit assemblies (PCAs) or communication channel media.

In an example embodiment, the processor 202 is configured, with the content of the memory 204, and optionally with other components described herein, to cause the apparatus 200 to determine a baseband signal and a modulated NIR signal by performing transformation of the sensed light, such as the sensed light 312 of FIG. 3. In an example embodiment, the sensed light 312 is transformed based on one of Fourier transformation and discrete cosine based transformation to determine the baseband signal and the modulated NIR signal. More specifically, on account of filtering of incident light, such as the incident light 302 of FIG. 3, by the IR cut-off filter 212, the NIR wavelengths are modulated to the carrier frequency corresponding to the frequency of the cosine mask, and the visible light wavelengths remains at baseband. Accordingly, by transformation of the sensed light in the Fourier spectrum, the baseband signal and the modulated NIR signal may be determined. In an example embodiment, a processing means may be configured to determine the baseband signal and the modulated NIR signal by performing transformation of the sensed light. An example of the processing means may include the processor 202, which may be an example of the controller 108.

In an example embodiment, the processor 202 is configured to, with the content of the memory 204, and optionally with other components described herein, to cause the apparatus 200 to determine the NIR spectrum associated with the incident light by demodulating the modulated NIR signal. The demodulation of the modulated NIR signal is further explained with reference to FIGS. 5 and 6. In an example embodiment, a processing means may be configured to determine the NIR spectrum associated with the incident light by demodulating the modulated NIR signal. An example of the processing means may include the processor 202, which may be an example of the controller 108.

In an example embodiment, the processor 202 is configured to, with the content of the memory 204, and optionally with other components described herein, to cause the apparatus 200 to remove the NIR spectrum from the baseband signal to determine the visible spectrum associated with the incident light. In an example embodiment, a processing means may be configured to remove the NIR spectrum from the baseband signal to determine the visible spectrum associated with the incident light. An example of the processing means may include the processor 202, which may be an example of the controller 108.

In an embodiment, a colour filter array (CFA) comprising at least some pixels with pass-band attributes for the NIR wavelengths is disposed between the lens 210 and the image sensor 214. In an example embodiment, the CFA is one of Red-Green-Blue (RGB) colour-based CFA (for example, a Bayer CFA) and a Cyan-Magenta-Yellow Key (CMYK) colour based CFA. The CFA disposed between the lens 210 and the image sensor 214 comprises at least some pixels (for example, some pixels from among red, green or blue pixels), which are associated with NIR pass-band characteristics for facilitating determination of the NIR spectrum. The filtered light, such as the filtered light 304 of FIG. 3, may pass through the CFA and be received by the image sensor 214, which may sense the filtered light as explained in conjunction with FIGS. 3, 4A and 4B to facilitate determination of the visible spectrum and the NIR spectrum.

In an example embodiment, the processor 202 is configured to, with the content of the memory 204, and optionally with other components described herein, to cause the apparatus 200 to compute depth information associated with the object based on the NIR spectrum. The computation of depth information from the NIR spectrum is explained with reference to FIG. 7. In an example embodiment, a processing means may be configured to compute depth information associated with the object based on the NIR spectrum. An example of the processing means may include the processor 202, which may be an example of the controller 108. The determination of the visible spectrum and the NIR spectrum is further explained with reference to FIGS. 5 and 6.

Figure 5:
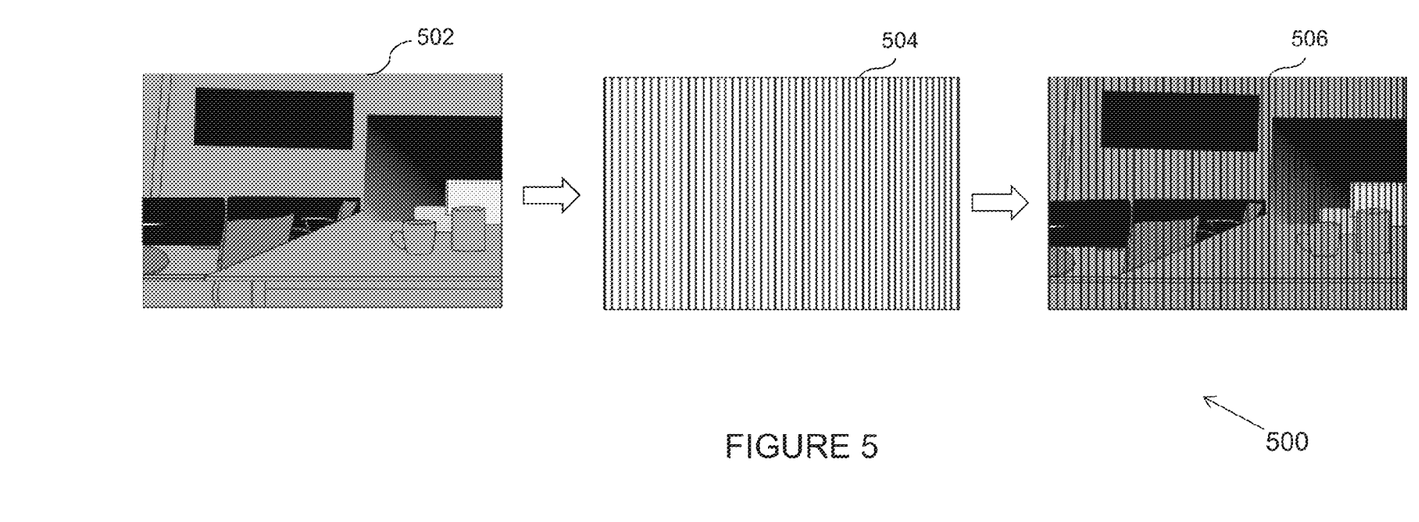
FIG. 5 illustrates an exemplary visual representation of filtering of incident light by an IR cut-off filter in accordance with an example embodiment.

FIG. 5 illustrates an exemplary visual representation 500 of filtering of incident light by an IR cut-off filter, such as the IR cut-off filter 212 of apparatus 200, in accordance with an example embodiment. The visual representation 500 depicts a gray scale image 502 corresponding to a captured scene of an indoor environment. The gray scale image 502 embodies an image corresponding to incident light, such as the incident light 302 explained with reference to FIG. 3. The IR cut-off filter is represented as a mask 504 with spatially varying transparency attributes. It is noted that though the transparency attribute of the mask 504 is depicted to vary along the Y-axis, it is understood that the transparency attribute of the mask 504 may vary along any direction to configure the cosine function of spatial location based attenuation. The mask 504 is hereinafter referred to as a cosine mask as the transparency is configured to vary with cosine-function of pixel spatial location. The gray scale image 502 upon being subjected to filtering by the cosine mask configures a masked image 506, which embodies the filtered light sensed by an image sensor, such as the image sensor 214 of apparatus 200. As explained with reference to FIGS. 2 and 3, such a filtering of the incident light corresponds to amplitude modulation of the NIR wavelengths. The amplitude modulation is mathematically explained with reference to equations (1) to (3) below:

In an example embodiment, gray-scale intensity values (for example, obtained using conventional imaging pipeline) corresponding to the gray scale image 502 is denoted as I(x,y) and the cosine mask's transparency is configured such that a gain G(x,y) attributed by the cosine mask is expressed as depicted in equation (1):

$$G(x, y) = 0.5 * \left(1 + \cos\left(2\pi\left(\frac{xw_x}{M} + \frac{yw_y}{N}\right)\right)\right) \quad \text{Eq. (1)}$$

where G(x,y)=0 indicates all the incident light is suppressed by the cosine mask and G(x,y)=1 indicates no suppression of the incident light, and, where $$\frac{w_x}{M} \text{ and } \frac{w_y}{N}$$

are x and y spatial frequencies for the cosine mask; M and N are total number of pixels on the image sensor in x and y direction and x and y are coordinates of each pixel.

The gray scale intensity of modulation (depicted as H(x,y)) by such a cosine mask is expressed as depicted in equations (2) and (3):

$$H(x, y) = G(x, y) * I(x, y) \quad \text{Eq. (2)}$$

$$H(x, y) = 0.5 * \left(1 + \cos\left(2\pi\left(\frac{xw_x}{M} + \frac{yw_y}{N}\right)\right)\right) * I(x, y) \quad \text{Eq. (3)}$$

Accordingly, the sensed light at the image sensor includes the unmodulated visible spectrum and modulated NIR wavelengths. The sensed light is subjected to transformation, for example using Fourier transform, to determine the modulated NIR signal and the baseband signal corresponding to the incident light. An exemplary Fourier spectrum depicting the determined baseband signal and the modulated NIR signal are depicted in FIG. 6.

Figure 6:
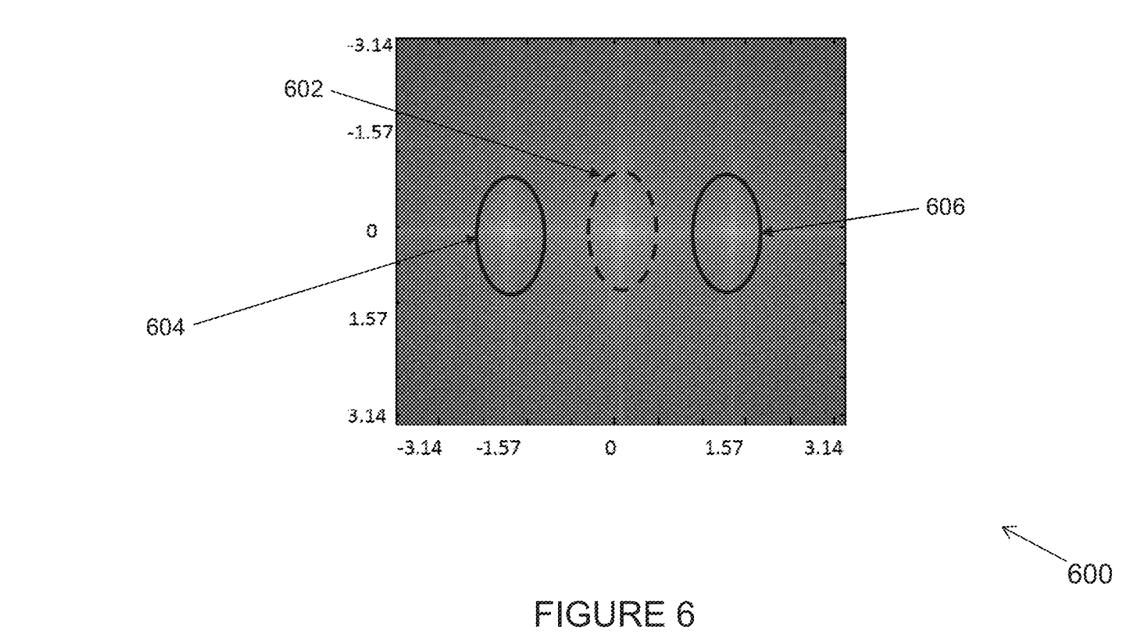
FIG. 6 depicts a Fourier spectrum of a masked image for illustrating the determination of the NIR spectrum in accordance with an example embodiment.

FIG. 6 depicts a Fourier spectrum 600 of the masked image 506 for illustrating the determination of the NIR spectrum in accordance with an example embodiment. The Fourier spectrum 600 depicts a dotted encircled portion 602 corresponding to the baseband signal, i.e. the visible spectrum with little overlap from the NIR spectrum. The Fourier spectrum 600 further depicts two encircled portions 604 and 606, each of which corresponds to the modulated NIR signal. The demodulation of the modulated NIR signal may be formed as explained in the following illustrative example:

If I(x,y) corresponds to signal intensities in IR spectrum and J(x,y) corresponds to the pixel intensities in the visible spectrum, then only IR intensities are amplitude modulated. The superimposition of amplitude modulated IR and unmodulated visible intensities may be expressed as depicted in equation (4), where H(x,y) corresponds to the intensities in the masked image 506:

$$H(x, y) = I(x, y)\left[\frac{1}{2} + \frac{1}{2}\cos\left(2\pi\left(\frac{xw_x}{M} + \frac{yw_y}{N}\right)\right)\right] + J(x, y) \quad \text{Eq. (4)}$$

It is understood that the bias of ½ and the scaling of the cosine function by ½ in the amplitude modulation of IR is included in equation (4) to ensure that the attenuation factor do not take on negative values on account of the cosine function.

If $$\theta = 2\pi\left(\frac{xw_x}{M} + \frac{yw_y}{N}\right)$$

then equation (4) may be manipulated as exemplarily depicted using the in phase component $H_i(x,y)$ in the following equations (5) to (9):

$$H_i(x,y)=\tfrac{1}{2}I(x,y)[1+\cos(\theta)]\cos(\theta)+J(x,y)\cos(\theta) \quad \text{Eq. (5)}$$

$$H_i(x,y)=\tfrac{1}{2}I(x,y)[\cos(\theta)+\cos^2(\theta)]+J(x,y)\cos(\theta) \quad \text{Eq. (6)}$$

$$H_i(x,y)=\tfrac{1}{2}I(x,y)[\cos(\theta)+(\tfrac{1}{2}+\tfrac{1}{2}\cos(2\theta))]+J(x,y)\cos(\theta) \quad \text{Eq. (7)}$$

$$H_i(x,y)=\tfrac{1}{2}I(x,y)[\tfrac{1}{2}+\cos(\theta)+\tfrac{1}{2}\cos(2\theta)]+J(x,y)\cos(\theta) \quad \text{Eq. (8)}$$

$$H_i(x,y)=\tfrac{1}{4}I(x,y)+[\tfrac{1}{2}I(x,y)+J(x,y)]\cos(\theta)+\tfrac{1}{4}I(x,y)\cos(2\theta) \quad \text{Eq. (9)}$$

A low pass filter with cut-off at θ/2 may then be applied to the signal represented by equation (9) to remove all high frequency components from cosine products, since both I(x, y) and J(x,y) are band limited to less than θ/2 to determine the NIR spectrum as depicted in equation (10):

$$LPF\{H_i(x,y)\}_{\theta/2}=\tfrac{1}{4}I(x,y) \quad \text{Eq. (10)}$$

Upon determining the signal intensities corresponding to the NIR spectrum, i.e. I(x,y), the signal intensities may be removed from the signal intensities corresponding to the masked image 506 i.e. H(x,y) to determine the pixel intensities corresponding to the visible spectrum, i.e. J(x,y). The determined visible spectrum and the NIR spectrum corresponding to the incident light may be utilized in refining the captured image. In an example embodiment, the determined NIR spectrum may be utilized in de-hazing of the captured image. In an example embodiment, the NIR spectrum may also be utilized in computing depth of object associated with the captured image. An exemplary depth computation is explained with reference to FIG. 7.

Figure 7:
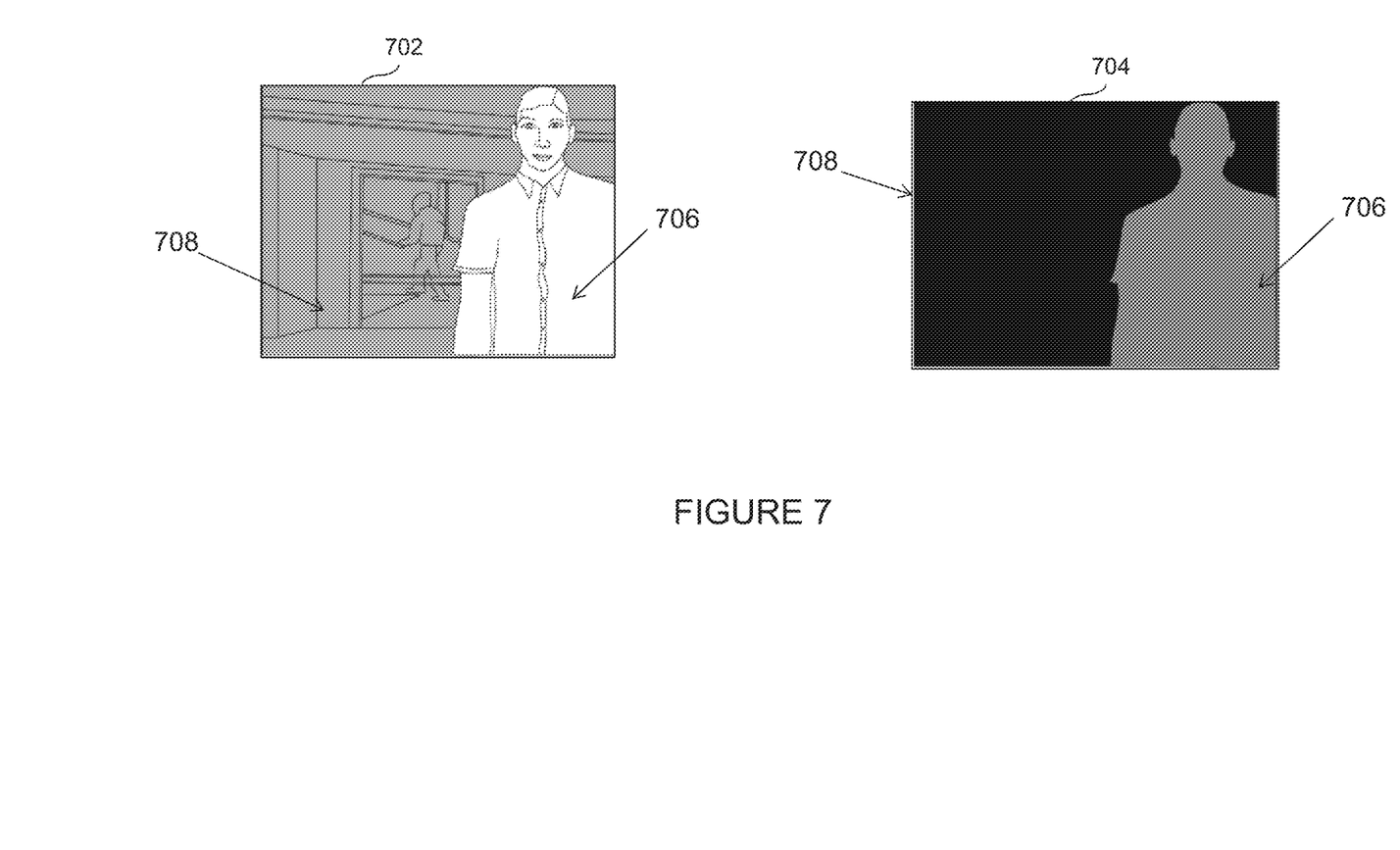
FIG. 7 illustrates a depth map corresponding to an image captured using the apparatus of FIG. 2 in accordance with an example embodiment.

FIG. 7 illustrates a depth map 704 corresponding to an image 702 captured using the apparatus 200 of FIG. 2 in accordance with an example embodiment. As stated in reference with FIGS. 2 and 3, the determined NIR spectrum and the visible spectrum may be utilized in computing a depth map. It is understood that a depth map corresponds to an image including information relating to the distance of the surfaces of scene objects from a viewpoint. For example, the image 702 includes a foreground portion 706 (including the object of interest during image capture, for example, an individual in this case) and a background portion 708. The depth map 704 of the image 702 clearly delineates the difference in distances of the foreground portion, or the object, and the background portion from an image capture viewpoint. More specifically, the foreground portion 706 is depicted as shaded in a lighter hue in the depth map 704 and the background portion 708 is depicted as shaded in darker hue.

A depth map, such as the depth map 704, may be computed from the determined NIR spectrum using a variety of known and/or proprietary techniques. For example, an image sensor, such as the image sensor 214 of the apparatus 200, may be configured to capture a scene illuminated with a structured pattern in NIR wavelengths (corresponding to the determined NIR spectrum), which do not generally interfere with visible light. Given the knowledge of the structured pattern and the acquired NIR image, depth information may be computed using known techniques. In another embodiment, an IR flash may be utilized to illuminate an object with NIR wavelengths (corresponding to the determined NIR spectrum) and energy in the reflected NIR signals may be measured to estimate the distance from the objects and compute the depth map therefrom. The computed depth map may be useful for a variety of applications. For example, depth maps can be used to selectively blur an image to varying degrees. Depth maps may also be used to make the rendering of 3D scenes more efficient. The depth maps may also be used to create shadows cast by illumination in 3D computer graphics. A method for sensing of visible spectrum and NIR spectrum is explained with reference to FIG. 8.

Figure 8:
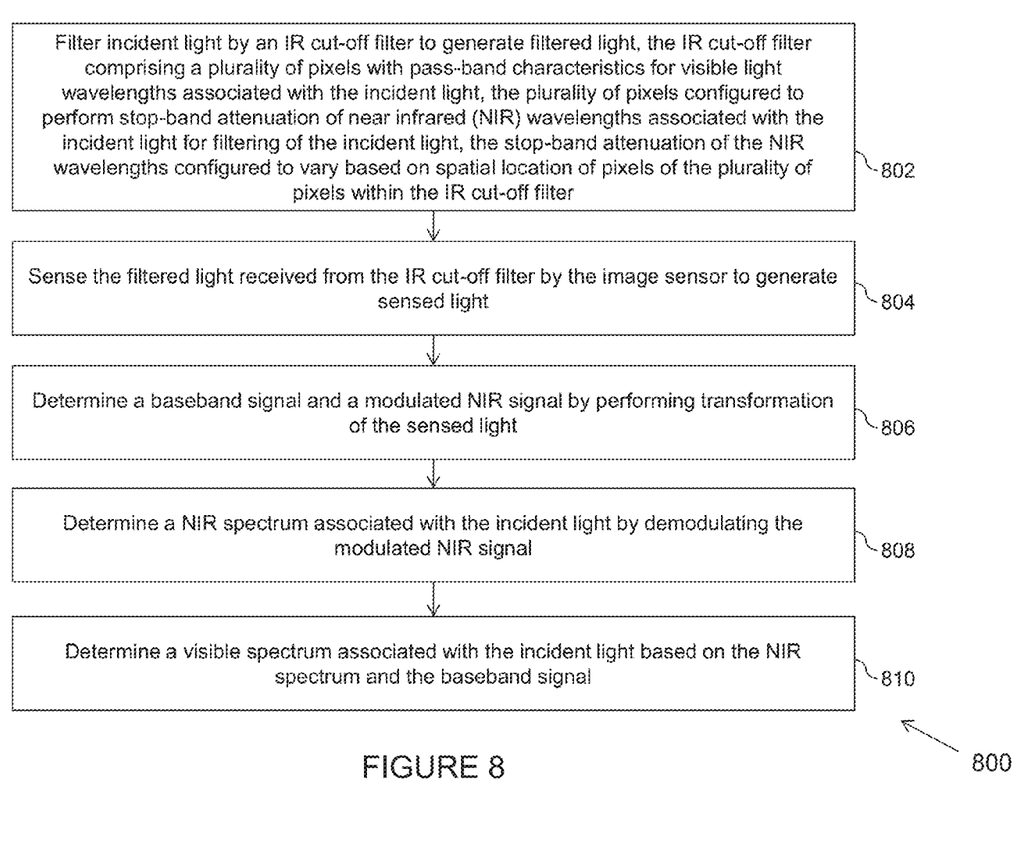
FIG. 8 is a flowchart depicting an example method for sensing of visible spectrum and NIR spectrum in accordance with an example embodiment.

FIG. 8 is a flowchart depicting an example method 800 for sensing of visible spectrum and NIR spectrum in accordance with an example embodiment. The method 800 depicted in flow chart may be executed by, for example, the apparatus 200 of FIG. 2. Operations of the flowchart, and combinations of operation in the flowchart, may be implemented by various means, such as hardware, firmware, processor, circuitry and/or other device associated with execution of software including one or more computer program instructions. For example, one or more of the procedures described in various embodiments may be embodied by computer program instructions. In an example embodiment, the computer program instructions, which embody the procedures, described in various embodiments may be stored by at least one memory device of an apparatus and executed by at least one processor in the apparatus. Any such computer program instructions may be loaded onto a computer or other programmable apparatus (for example, hardware) to produce a machine, such that the resulting computer or other programmable apparatus embody means for implementing the operations specified in the flowchart. These computer program instructions may also be stored in a computer-readable storage memory (as opposed to a transmission medium such as a carrier wave or electromagnetic signal) that may direct a computer or other programmable apparatus to function in a particular manner, such that the instructions stored in the computer-readable memory produce an article of manufacture the execution of which implements the operations specified in the flowchart. The computer program instructions may also be loaded onto a computer or other programmable apparatus to cause a series of operations to be performed on the computer or other programmable apparatus to produce a computer-implemented process such that the instructions, which execute on the computer or other programmable apparatus provide operations for implementing the operations in the flowchart. The operations of the method 800 are described with help of apparatus 200 of FIG. 2. However, the operations of the method can be described and/or practiced by using any other apparatus.

At block 802 of the method 800, incident light is filtered by an IR cut-off filter, such as the IR cut-off filter 212 of apparatus 200, disposed in an optical path between a lens and an image sensor to generate filtered light. The IR cut-off filter includes a plurality of pixels with pass-band characteristics for visible light wavelengths associated with the incident light. The plurality of pixels is configured to perform stop-band attenuation of near infrared (NIR) wavelengths associated with the incident light for filtering of the incident light. The stop-band attenuation of NIR wavelengths is configured to vary based on spatial location of pixels of the plurality of pixels within the IR cut-off filter. In an embodiment, the stop-band attenuation of the NIR wavelengths is configured to vary based on spatial location of pixels of the plurality of pixels within the IR cut-off filter. In an embodiment, the stop-band attenuation of NIR wavelengths is configured to vary based on a cosine-function of spatial location of the pixels. In an embodiment, variance of the stop-band attenuation of the NIR wavelengths based on the cosine-function of spatial location of the pixels is achieved by pre-configuring a transparency attribute associated with each pixel of the plurality of pixels. For example, a transparency attribute may vary from pixel-to pixel, with some pixels being completely opaque, some being completely transparent and while some being partly transparent (or partly opaque) as depicted in FIG. 3. As a result, the stop-band attenuation of the NIR wavelengths may vary from one pixel to another, with pixels permitting low energy to zero energy to pass for the NIR wavelengths. As explained with reference to FIGS. 5 and 6, performing of the stop-band attenuation of NIR wavelengths based on a cosine-function of spatial location of the pixels corresponds to performing amplitude modulation of the NIR wavelengths associated with the incident light.

At block 804 of the method 800, the filtered light received from the IR cut-off filter is sensed by the image sensor, such as the image sensor 214 of the apparatus 200 to generate sensed light. At block 806 of the method 800, a baseband signal and a modulated NIR signal are determined by performing transformation of the sensed light. In an example embodiment, the sensed light is transformed based on one of Fourier transformation and discrete cosine based transformation to determine the baseband signal and the modulated NIR signal. More specifically, on account of filtering the incident light by the IR cut-off filter, the NIR wavelengths are modulated to the carrier frequency corresponding to the frequency of the cosine mask, and the visible light wavelengths remains at baseband. Accordingly, by transformation of the sensed light in the Fourier spectrum, the baseband signal and the modulated NIR signal may be determined.

At block 808, a NIR spectrum associated with the incident light is determined by demodulating the modulated NIR signal. At block 810, a visible spectrum associated with the incident light is determined based on the NIR spectrum and the baseband signal. In an embodiment, the NIR spectrum may be removed from the baseband signal to determine the visible spectrum associated with the incident light. The determination of the visible spectrum and the NIR spectrum may be performed as explained with reference to FIGS. 5 and 6.

In an embodiment, a colour filter array (CFA) including at least some pixels with pass-band attributes for the NIR wavelengths is disposed between the lens and the image sensor. In an example embodiment, the CFA is one of Red-Green-Blue (RGB) colour-based CFA (for example, a Bayer CFA) and a Cyan-Magenta-Yellow Key (CMYK) colour based CFA. The CFA disposed between the lens and the image sensor comprises at least some pixels (for example, some pixels from among red, green or blue pixels), which are associated with NIR pass-band characteristics for facilitating determination of the NIR spectrum. The filtered light may pass through the CFA and be received by the image sensor, which may sense the filtered light as explained above to facilitate determination of the visible spectrum and the NIR spectrum. In an example embodiment, depth information associated with the object may be computed based on the NIR spectrum as explained with reference to FIG. 7.

To facilitate discussion of the method 800, certain operations are described herein as constituting distinct steps performed in a certain order. Such implementations are exemplary and non-limiting. Certain operation may be grouped together and performed in a single operation, and certain operations can be performed in an order that differs from the order employed in the examples set forth herein. Moreover, certain operations of the method 800 are performed in an automated fashion. These operations involve substantially no interaction with the user. Other operations of the method 800 may be performed by in a manual fashion or semi-automatic fashion. These operations involve interaction with the user via one or more user interface presentations.

Without in any way limiting the scope, interpretation, or application of the claims appearing below, a technical effect of one or more of the example embodiments disclosed herein is to perform sensing of the visible spectrum and the NIR spectrum. As explained in FIGS. 2-8, the NIR part of the spectrum is modulated to a different part of Fourier spectrum to facilitate sensing of the visible spectrum and the NIR spectrum simultaneously. Such, simultaneous sensing of the visible spectrum and the NIR spectrum is performed using a single image sensor, thereby precluding the need of employing a dedicated NIR sensor. In addition to cost and space saving, precluding the need of two sensors also alleviates alignment concerns that are typical for arrangements employing two sensors. The sensed NIR spectrum may be utilized for a variety of applications, such as for dehazing (i.e. removing haze from images captured in foggy conditions or in general in conditions with obstacles in air that affect a clarity of the image), for depth computation and the like.

Various embodiments described above may be implemented in software, hardware, application logic or a combination of software, hardware and application logic. The software, application logic and/or hardware may reside on at least one memory, at least one processor, an apparatus or, a computer program product. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of an apparatus described and depicted in FIGS. 1 and/or 2. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the embodiments are set out in the independent claims, other aspects comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications, which may be made without departing from the scope of the present disclosure as defined in the appended claims.

We claim:

1. A method comprising:
    filtering incident light by an infrared (IR) cut-off filter disposed in an optical path between a lens and an image sensor to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter;

sensing the filtered light received from the IR cut-off filter by the image sensor to generate sensed light, wherein the IR cut-off filter comprises spatially varying transparency attributes configured to vary along a direction to configure a cosine-function of spatial location based attenuation;

determining a baseband signal with an unmodulated visible spectrum and an amplitude modulated NIR signal by performing the cosine-function based transformation of the sensed light;

determining a NIR spectrum associated with the incident light by demodulating the modulated NIR signal; and determining a visible spectrum associated with the incident light based on the NIR spectrum and the baseband signal.

2. The method as claimed in claim 1, wherein the stop-band attenuation of the NIR wavelengths is configured to vary based on the cosine-function of spatial location of the pixels.

3. The method as claimed in claim 2, wherein variance of the stop-band attenuation of the NIR wavelengths based on the cosine-function of spatial location of the pixels is achieved by pre-configuring a transparency attribute associated with each pixel of the plurality of pixels.

4. The method as claimed in claim 2, wherein filtering incident light based on the cosine-function of spatial location of the pixels corresponds to performing amplitude modulation of the NIR wavelengths associated with the incident light.

5. The method as claimed in claim 1, wherein the sensed light is transformed based on one of Fourier transformation and discrete cosine based transformation to determine the baseband signal and the modulated NIR signal.

6. The method as claimed in claim 1, wherein the NIR spectrum is removed from the baseband signal to determine the visible spectrum.

7. The method as claimed in claim 1, wherein a colour filter array (CFA) comprising at least some pixels with pass-band attributes for the NIR wavelengths is disposed between the lens and the image sensor.

8. The method as claimed in claim 1, wherein the incident light corresponds to the light reflected from an object of interest during image capture, and wherein the method further comprises computing depth information associated with the object based on the NIR spectrum.

9. An apparatus comprising:
an image capture module comprising:
a lens configured to receive incident light;
an IR cut-off filter configured to receive the incident light from the lens and filter the incident light to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; and
an image sensor configured to sense the filtered light received from the IR cut-off filter to generate sensed light, wherein the IR cut-off filter comprises spatially varying transparency attributes configured to vary along a direction to configure a cosine-function of spatial location based attenuation;

at least one processor; and
at least one memory comprising computer program code, the at least one memory and the computer program code configured to, with the at least one processor, cause the apparatus to at least perform:
determine a baseband signal with an unmodulated visible spectrum and an amplitude modulated NIR signal by performing the cosine-function based transformation of the sensed light;
determine a NIR spectrum associated with the incident light by demodulating the modulated NIR signal; and
determine a visible spectrum associated with the incident light based on the NIR spectrum and the baseband signal.

10. The apparatus as claimed in claim 9, wherein the stop-band attenuation of the NIR wavelengths is configured to vary based on the cosine-function of spatial location of the pixels.

11. The apparatus as claimed in claim 10, wherein variance of the stop-band attenuation of the NIR wavelengths based on the cosine-function of spatial location of the pixels is achieved by pre-configuring a transparency attribute associated with each pixel of the plurality of pixels.

12. The apparatus as claimed in claim 10, wherein filtering incident light based on the cosine-function of spatial location of the pixels corresponds to performing amplitude modulation of the NIR wavelengths associated with the incident light.

13. The apparatus as claimed in claim 9, wherein the sensed light is transformed based on one of Fourier transformation and discrete cosine based transformation to determine the baseband signal and the modulated NIR signal.

14. The apparatus as claimed in claim 9, wherein the NIR spectrum is removed from the baseband signal to determine the visible spectrum.

15. The apparatus as claimed in claim 9, wherein the image capture module further comprises a colour filter array (CFA) disposed between the lens and the image sensor, the CFA comprising at least some pixels with pass-band attributes for the NIR wavelengths.

16. The apparatus as claimed claim 9, wherein the incident light corresponds to light reflected from an object of interest during image capture, and wherein the apparatus is further caused, at least in part, to:
compute depth information associated with the object based on the NIR spectrum.

17. A computer program product comprising at least one non-transitory computer-readable storage medium, the non-transitory computer-readable storage medium comprising a set of instructions, which, when executed by one or more processors, cause an apparatus to at least perform:
filter incident light by an IR cut-off filter disposed in an optical path between a lens and an image sensor to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter;
sense the filtered light received from the IR cut-off filter by the image sensor to generate sensed light, wherein the IR cut-off filter comprises spatially varying transparency attributes configured to vary along a direction to configure a cosine-function of spatial location based attenuation;

determine a baseband signal with an unmodulated visible spectrum and an amplitude modulated NIR signal by performing the cosine-function based transformation of the sensed light;

determine a NIR spectrum associated with the incident light by demodulating the modulated NIR signal; and determine a visible spectrum associated with the incident light based on the NIR spectrum and the baseband signal.

18. The computer program product as claimed in claim 17, wherein the stop-band attenuation of the NIR wavelengths is configured to vary based on the cosine-function of spatial location of the pixels.

19. The computer program product as claimed in claim 18, wherein variance of the stop-band attenuation of the NIR wavelengths based on the cosine-function of spatial location of the pixels is achieved by pre-configuring a transparency attribute associated with each pixel of the plurality of pixels.

20. The computer program product as claimed in claim 18, wherein filtering incident light based on the cosine-function of spatial location of the pixels corresponds to performing amplitude modulation of the NIR wavelengths associated with the incident light.

21. The computer program product as claimed in claim 17, wherein the incident light corresponds to light reflected from an object of interest during image capture, and wherein the apparatus is further caused, at least in part, to:

compute depth information associated with the object based on the visible spectrum and the NIR spectrum.

22. An apparatus comprising:
an image capture module comprising:
a lens configured to receive incident light;
an IR cut-off filter configured to receive the incident light from the lens and filter the incident light to generate filtered light, the IR cut-off filter comprising a plurality of pixels with pass-band characteristics for visible light wavelengths associated with the incident light, the plurality of pixels configured to perform stop-band attenuation of near infrared (NIR) wavelengths associated with the incident light for filtering of the incident light, the stop-band attenuation of the NIR wavelengths configured to vary based on spatial location of pixels of the plurality of pixels within the IR cut-off filter; and
an image sensor configured to sense the filtered light received from the IR cut-off filter to generate sensed light, wherein the IR cut-off filter comprises spatially varying transparency attributes configured to vary along a direction to configure a cosine-function of spatial location based attenuation;
means for determining a baseband with an unmodulated visible spectrum signal and an amplitude modulated NIR signal by performing the cosine-function based transformation of the sensed light;
means for determining a NIR spectrum associated with the incident light by demodulating the modulated NIR signal; and
means for determining a visible spectrum associated with the incident light based on the NIR spectrum and the baseband signal.

* * * * *